United States Patent
Kautz

(10) Patent No.: US 11,573,255 B2
(45) Date of Patent: Feb. 7, 2023

(54) METHOD FOR ESTIMATING THE COVERED AREA OF A DIRECTIVE ANTENNA OF A LOCAL POSITIONING SYSTEM WHILE SETTING UP SAID SYSTEM

(71) Applicants: SWISS TIMING LTD, Corgemont (CH); FRIEDRICH-ALEXANDER-UNIVERSITAET ERLANGEN-NUERNBERG, Erlangen (DE)

(72) Inventor: Thomas Kautz, Sangerhausen (DE)

(73) Assignees: SWISS TIMING LTD, Corgemont (CH); FRIEDRICH-ALEXANDER-UNIVERSITAET ERLANGEN-NUERNBERG, Erlangen (DE)

( * ) Notice: Subject to any disclaimer, the term of this patent is extended or adjusted under 35 U.S.C. 154(b) by 472 days.

(21) Appl. No.: 16/617,929

(22) PCT Filed: Jun. 11, 2018

(86) PCT No.: PCT/EP2018/065402
§ 371 (c)(1),
(2) Date: Nov. 27, 2019

(87) PCT Pub. No.: WO2018/229014
PCT Pub. Date: Dec. 20, 2018

(65) Prior Publication Data
US 2020/0191847 A1    Jun. 18, 2020

(30) Foreign Application Priority Data

Jun. 13, 2017   (EP) .................................... 17175719

(51) Int. Cl.
*G01R 29/10*     (2006.01)
*H04W 16/20*    (2009.01)
*H04W 64/00*    (2009.01)

(52) U.S. Cl.
CPC ............ *G01R 29/10* (2013.01); *H04W 16/20* (2013.01)

(58) Field of Classification Search
CPC ....... G01R 29/10; G01R 29/14; H04W 16/20; H04W 64/003; H04W 64/00; G01S 5/06; G01S 5/12; G01S 13/75; G01S 13/878
See application file for complete search history.

(56) References Cited

U.S. PATENT DOCUMENTS 5,668,562 A * 9/1997 Cutrer .................... G01R 29/10
                                                           343/893
6,141,558 A * 10/2000 Chen ........................ G01S 3/58
                                                           455/456.1
(Continued)

OTHER PUBLICATIONS

Farid, Z. et al, "Recent Advances in Wireless Indoor Localization Techniques and System," Journal of Computer Networks and Communications, vol. 22, Jan. 31, 2013, XP055311162, 13 pages.
(Continued)

*Primary Examiner* — Thai Pham
(74) *Attorney, Agent, or Firm* — Oblon, McClelland, Maier & Neustadt, L.L.P.

(57) ABSTRACT

The invention relates to a method (MTH) for estimating the coverage area of a directive antenna of a local positioning system while setting up said system, said antenna being located in the vicinity of an area of interest, the method (MTH) comprising the following steps: —Distributing (DIS_TR) a plurality of transponders over the area of interest—Performing (MSD_SS) measurements of signal (Continued)

strength between the antenna and said transponders—Estimating (EST_CV) the coverage area by using said measurements.

5 Claims, 2 Drawing Sheets

(56) References Cited

U.S. PATENT DOCUMENTS

| | | | |
|---|---|---|---|
| 2005/0035897 A1* | 2/2005 | Perl | G01S 5/12 |
| | | | 342/36 |
| 2008/0182528 A1 | 7/2008 | Le | |
| 2013/0183961 A1 | 7/2013 | Bassiri et al. | |
| 2015/0296388 A1* | 10/2015 | Bassi | H04W 24/10 |
| | | | 455/446 |
| 2018/0359720 A1* | 12/2018 | Kautz | G01S 13/878 |

OTHER PUBLICATIONS

International Preliminary Report on Patentability dated Aug. 27, 2019 in PCT/EP2018/065402 filed on Jun. 11, 2018.
International Search Report dated Jul. 3, 2018 in PCT/EP2018/065402 filed on Jun. 11, 2018.

* cited by examiner

METHOD FOR ESTIMATING THE COVERED AREA OF A DIRECTIVE ANTENNA OF A LOCAL POSITIONING SYSTEM WHILE SETTING UP SAID SYSTEM

FIELD OF THE INVENTION

The invention relates to the field of local positioning systems having directive antennae. In particular, the invention relates to a method for estimating the covered area of a directive antenna of a local positioning system while setting up said system.

BACKGROUND OF THE INVENTION

In recent years, there has been an increasing demand for reliable and objective evaluation of sport specific data. The measurement and analysis of the trajectories of athletes is one possible approach to gain such insights. It allows the assessment of the physical performance and tactical behavior of athletes. Thus, it can yield helpful feedback for athletes, coaches and referees. Furthermore, spectators can be supplied with additional information about the accomplishments of their idols.

Local Positioning Systems (LPS) provide a means for the measurement of athletes' positions and motion trajectories. State-of-the-art systems use time-of-arrival or time-difference-of-arrival measurements of electromagnetic waves. These electromagnetic waves travel between antennae with fixed and known positions and mobile transponders (tags) with unknown and variable positions. Using the timing measurements from several antennae with respect to the mobile transponder, the position of the mobile transponder in the coordinate system of the local positioning system can be determined. When such a mobile transponder is attached to an object or person, the position of this object or person can be determined from the position of the mobile transponder.

Usually, directive antennae are preferred over omnidirectional antennae in order to extend the ranges of the radio coverage areas. Throughout this text, 'range' shall mean the maximum distance to the antenna to which the transponder may be located in order to receive electromagnetic waves from said antenna. In addition, 'coverage area' shall mean the area on which the transponder must be located to receive electromagnetic waves from said antenna.

For illustrative purposes only, a radiation pattern of a typical directive antenna is given in FIGS. 1a and 1b. In particular, FIG. 1a shows the horizontal radiation pattern and FIG. 1b shows the vertical pattern. It is to be noted that 'radiation pattern' refers to the angular dependence of the strength of the electromagnetic waves from the antenna.

An important issue regarding the antenna coverage of an area of interest is the difficulty of finding out which area can be covered by which antenna during system setup. The position and orientation of each antenna is of vital importance for optimal coverage of the area of interest and hence for accurate and continuous position tracking. Although some heuristics for antennae placement have been proposed in the literature, finding the best positions and orientations is difficult in practice since the operator does not get any feedback about the current system coverage while setting up the system. Hence, the placement and orientation needs to be based on experience and rough manual estimates about which area is covered by a given antennae. Estimating the covered area is made even more difficult by obstacles in the line-of-sight of the antenna (ceiling, flags, etc.). Simulation of the signal propagation could provide some guidance for the operator, but these would require extensive modelling of the venue in order to obtain realistic results.

SUMMARY OF THE INVENTION

It is an object of the invention to overcome these drawbacks.

Hence, the invention relates to a method for estimating the coverage area of a directive antenna of a local positioning system while setting up said system, said antenna being located in the vicinity of an area of interest, the method comprising the following steps:
  Distributing a plurality of transponders over the area of interest
  Performing measurements of signal strength between the antenna and said transponders
  Estimating the coverage area by using said measurements.

According to the invention, multiple transponders are distributed over the area of interest and the strength/quality or the signal transmission between these transponders and the antenna is measured. By combining these measurements, the coverage area of the antenna can be estimated. This approach facilitates the LPS setup because the operator can get feedback about the suitability of the installation while adjusting the antenna position and/or orientation. With this information, the coverage can be optimized by adapting the position and/or orientation of the antenna in an automated or manual way.

Furthermore, the method according to the invention may comprise one or a combination of the following characteristics.

In a non-limited embodiment, the step of performing measurements comprises:
  Emitting a signal by each of the plurality of transponders
  Receiving at least two of said signals by the antenna
  Measuring a power indicator for each received signals.

In a non-limited embodiment, the power indicator is the Received Signal Strength Indicator.

In a non-limited embodiment, the step of estimating the coverage area comprises sorting the transponders according to whether or not the signal they have emitted has been received by the antenna and according to the power indicators for the received signals.

In a non-limited embodiment, the step of estimating the coverage area comprises producing a coverage map of the area of interest, according to the sorting.

In a non-limited embodiment, the step of distributing comprises homogeneously spreading the transponders on the area of interest.

BRIEF DESCRIPTION OF THE DRAWING

Other features and advantages of the present invention will appear more clearly upon reading the following detailed description, made with reference to the annexed drawings, given by way of non-limiting example.

DETAILED DESCRIPTION OF THE PREFERRED EMBODIMENTS

Figure 1A:
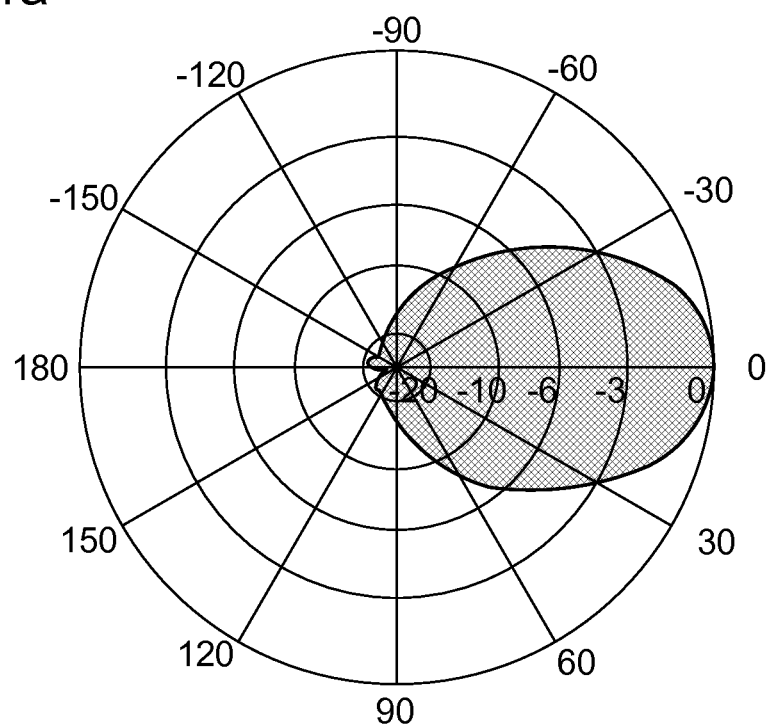
FIG. 1a shows the horizontal radiation pattern of a typical directive antenna
Figure 1B:
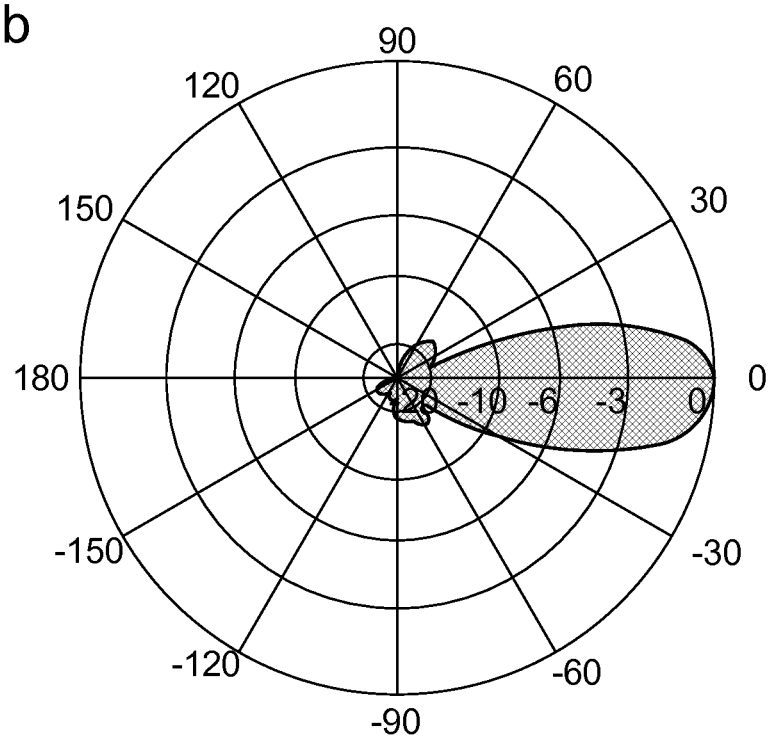
FIG. 1b shows the vertical radiation pattern of the antenna to which reference has been made in FIG. 1a FIG. 2 shows an environment comprising an area of interest on which a plurality of transponders are distributed, a directive antennae being located in the vicinity of said area of interest
Figure 2:
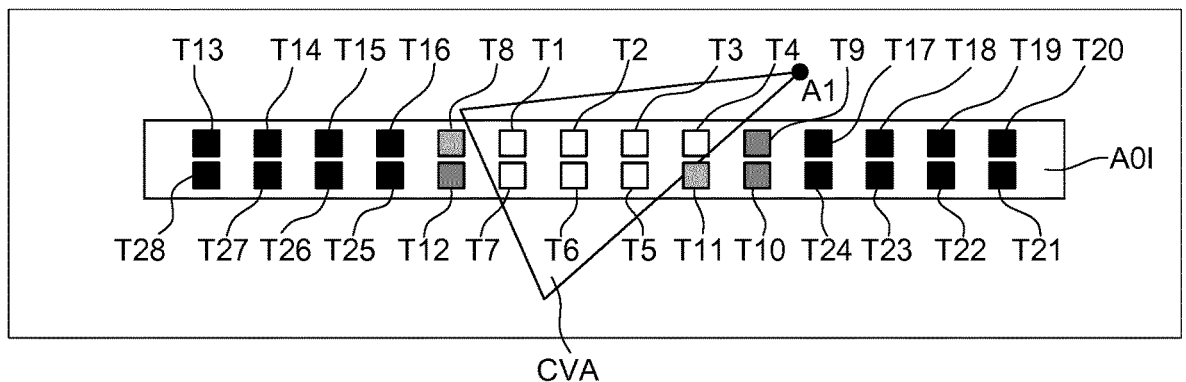
Figure 3:
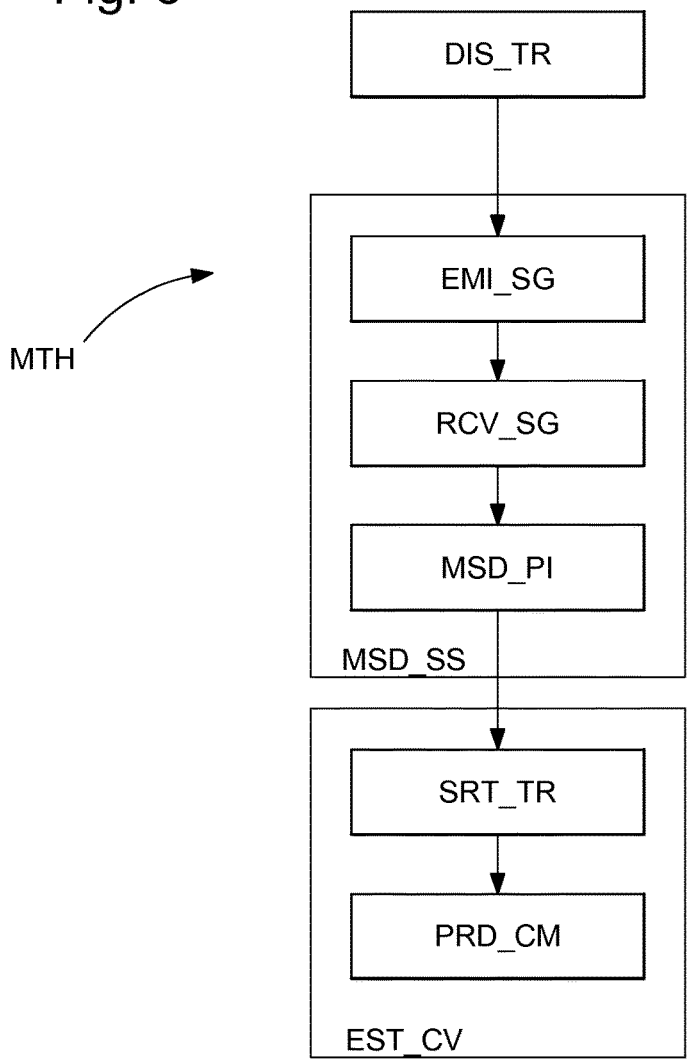
FIG. 3 shows a flow diagram illustrating the steps of a method according to the invention.

The method MTH offered by the invention addresses the difficulty in estimating the coverage area of a directive antenna of a local positioning system. FIG. 2 shows such a directive antenna A1, located in the vicinity of an area of interest AOI. For illustrative purposes, the coverage area CVA of said antenna A1 is approximated as a triangle.

In a first step DIS_TR of the method MTH according to the invention, a plurality of test transponders T1-T28 are distributed over the area of interest AOI, advantageously in a homogenous manner, that is to say spread all over the area of interest AOI and regularly spaced, as shown in FIG. 2.

In a second step MSD_SS of the method MTH according to the invention, measurements of signal strengths are performed.

According to a sub-step EMT_SG of this second step MSD_SS, each of the test transponders T1-T28 emits a signal. Understandably, depending on its position and its orientation, the antenna A1 can only receive some of these signals. In the example of FIG. 2, only seven transponders T1-T7 out of the twenty-eight depicted transponders are in the coverage area CVA of the antenna A1.

According a subsequent sub-step RCV_SG of this second step MSD_SS, as already mentioned, the antenna A1 receives some of the signals emitted by the transponders.

According to a subsequent sub-step MSD_PI of this second step MSD_SS, a power indicator relative to each received signal is measured. The power indicator is for instance calculated using the Received Signal Strength Indicator (RRSI), which is a measurement of the power present in a received radio signal. Most positioning systems provide a value for the RSSI for each signal transmission between a transponder and an antenna. A high RSSI indicates good signal strength/quality and vice versa.

In a third step EST_CV of the method MTH according to the invention, the coverage area CVA of the antenna A1 is estimated, on the basis of said measurements.

According a sub-step SRT_TR of this third step EST_CV, the test transponders T1-T28 are sorted in different categories, by using the measurements. For instance, the transponders the antenna received no signal from (T13-T28) are sorted in the category "no coverage", and the others (T1-T12) are sorted in the categories "good signal quality", "medium signal quality" and "poor signal quality". Of course, other categories and a different number of categories are conceivable. In the example of FIG. 2, five categories are represented: from white which is equivalent to a good signal quality to black which is equivalent to no coverage.

According a subsequent sub-step PRD_CM of this third step EST_CV, a coverage map is produced, by using the sorting. This provides intuitive feedback about the coverage of the antenna which helps optimizing the setup of the positioning system, that is to say find the optimal positions and orientations of the antenna, find out which parts of the area of interest are sufficiently covered, etc.

Of course, the present invention is not limited to the illustrated example but may be subject to various variants and alterations, which will be apparent to those skilled in the art.

The invention claimed is:

1. A method for estimating a coverage area of a local positioning system including a directive antenna and tracking athlete positions and motion trajectories while setting up said system, the method comprising:
   distributing a plurality of transponders over an area of interest;
   performing measurements of signal strength between the directive antenna and said transponders, the directive antenna being located in a vicinity of the area of interest; and
   estimating the coverage area of the local positioning system tracking athlete positions and motion trajectories by using said measurements,
   wherein the distributing further comprises homogeneously spreading the transponders on the area of interest, and
   wherein the estimating the coverage area further comprises sorting the transponders according to whether or not a signal they have emitted has been received by the antenna and according to power indicators for the received signals.

2. The method according to claim 1, wherein the performing measurements further comprises:
   emitting a signal by each of the plurality of transponders;
   receiving at least two of said signals by the antenna; and
   measuring a power indicator for each received signals.

3. The method according to claim 2, wherein the power indicator is a Received Signal Strength Indicator.

4. The method according to claim 1, wherein the estimating the coverage area further comprises producing a coverage map of the area of interest, according to the sorting.

5. The method according to claim 1, wherein the sorting includes designing one of three categories for each transponder, each category corresponding to an indication of signal quality.

* * * * *